(12) United States Patent
Furuno et al.

(10) Patent No.: US 11,088,056 B2
(45) Date of Patent: Aug. 10, 2021

(54) LEADFRAME AND LEADFRAME PACKAGE

(71) Applicant: Mitsui High-tec, Inc., Kitakyushu (JP)

(72) Inventors: Ryota Furuno, Kitakyushu (JP);
Kimihiko Kubo, Kitakyushu (JP)

( * ) Notice: Subject to any disclaimer, the term of this patent is extended or adjusted under 35 U.S.C. 154(b) by 0 days.

(21) Appl. No.: 16/660,818

(22) Filed: Oct. 23, 2019

(65) Prior Publication Data
US 2020/0135628 A1 Apr. 30, 2020

(30) Foreign Application Priority Data

Oct. 24, 2018 (JP) ............................. JP2018-200175

(51) Int. Cl.
*H01L 23/495* (2006.01)
*H01L 23/31* (2006.01)
*H01L 21/48* (2006.01)
*H01L 23/00* (2006.01)

(52) U.S. Cl.
CPC .... *H01L 23/49586* (2013.01); *H01L 23/3121* (2013.01); *H01L 23/49503* (2013.01); *H01L 23/49541* (2013.01); *H01L 21/4821* (2013.01); *H01L 24/48* (2013.01); *H01L 2224/48091* (2013.01); *H01L 2224/48106* (2013.01); *H01L 2224/48247* (2013.01); *H01L 2924/35121* (2013.01)

(58) Field of Classification Search
CPC .......... H01L 23/49586; H01L 23/3121; H01L 23/49503
See application file for complete search history.

(56) References Cited

U.S. PATENT DOCUMENTS

| | | | | |
|---|---|---|---|---|
| 5,937,279 A | * | 8/1999 | Sawada ............... | H01L 23/3142 438/123 |
| 2002/0056903 A1 | * | 5/2002 | Li ........................ | H01L 21/568 257/691 |
| 2004/0207056 A1 | * | 10/2004 | Seki ...................... | H01L 24/48 257/676 |
| 2007/0262432 A1 | * | 11/2007 | Otremba ........... | H01L 23/49524 257/678 |
| 2008/0150064 A1 | * | 6/2008 | Zimmerman ..... | H01L 23/49861 257/433 |
| 2018/0076118 A1 | * | 3/2018 | Shu ....................... | H01L 21/56 |

FOREIGN PATENT DOCUMENTS

JP  H9-199639  7/1997

* cited by examiner

*Primary Examiner* — Peniel M Gumedzoe
(74) *Attorney, Agent, or Firm* — Soei Patent & Law Firm

(57) ABSTRACT

A leadframe includes a substrate and a surface layer covering the substrate. The surface layer includes an acicular oxide containing CuO at a higher concentration than any other component of the acicular oxide. A leadframe package includes the leadframe, a semiconductor chip mounted on the leadframe, and a resin that covers the semiconductor chip and at least a part of the leadframe.

17 Claims, 21 Drawing Sheets

CuO

CuO

CuO

CuO/Cu$_2$O

Diffraction simulation

CuO [-1 2 1] incidence

Diffraction simulation $Cu_2O$ [0 0 1] incidence

US 11,088,056 B2

LEADFRAME AND LEADFRAME PACKAGE

CROSS-REFERENCE TO RELATED APPLICATIONS

This application claims the benefit of priority from Japanese Patent Application No. 2018-200175, filed Oct. 24, 2018, the entire contents of which are incorporated herein by reference.

FIELD

The present disclosure relates to a leadframe and a leadframe package.

BACKGROUND

A leadframe package includes a leadframe, a semiconductor chip mounted thereon and a resin sealing the semiconductor chip. In the manufacturing of a leadframe package, a leadframe and a semiconductor mounted thereon are covered with a thermosetting resin, and this is heated and cured. Among leadframes, there is a type of leadframe wherein the other side opposite to one side on which a semiconductor chip is mounted is exposed (for example, refer to Japanese Unexamined Patent Publication No. H9-199639).

SUMMARY

Heat generation of packages has increased in recent years due to high integration of wiring and large current therethrough, and it is feared that the interfaces between resins and leadframes may be debonded. In packages mounted in cars, further improvement in reliability is desired in view of safety.

In one aspect, a leadframe may comprise a substrate and a surface layer covering the substrate, wherein the surface layer includes an acicular oxide containing CuO at a higher concentration than any other component of the acicular oxide.

The above-mentioned leadframe may comprise a surface layer including an acicular oxide. The acicular oxide contains CuO as a main component. CuO can form hydrogen bonds with hydroxyl groups contained in the molecular structure of a resin. Therefore, the adhesion to the resin can be highly maintained under a high temperature condition also after packaging.

In one aspect, a leadframe package may comprise the above-mentioned leadframe, a semiconductor chip mounted on the leadframe, and a resin that covers the semiconductor chip and at least a part of the leadframe.

Since the above-mentioned leadframe package may comprise the above-mentioned leadframe, the adhesion between the resin and the leadframe can be maintained satisfactorily also after packaging. Therefore, the leadframe package is excellent in reliability.

According to the present disclosure, a leadframe which enables maintaining adhesion to a resin highly can be provided, A leadframe package which is excellent in reliability can be provided.

DETAILED DESCRIPTION

One example of the present disclosure will be described hereinafter with reference to figures depending on the case. However, the following example is illustration for describing the present disclosure, and is not intended to limit the present disclosure to the following contents. In description, the same components or components having the same function are indicated with the same and the same descriptions are omitted depending on the case. The dimensional ratio of each component is not limited to an illustrated ratio.

Figure 1:
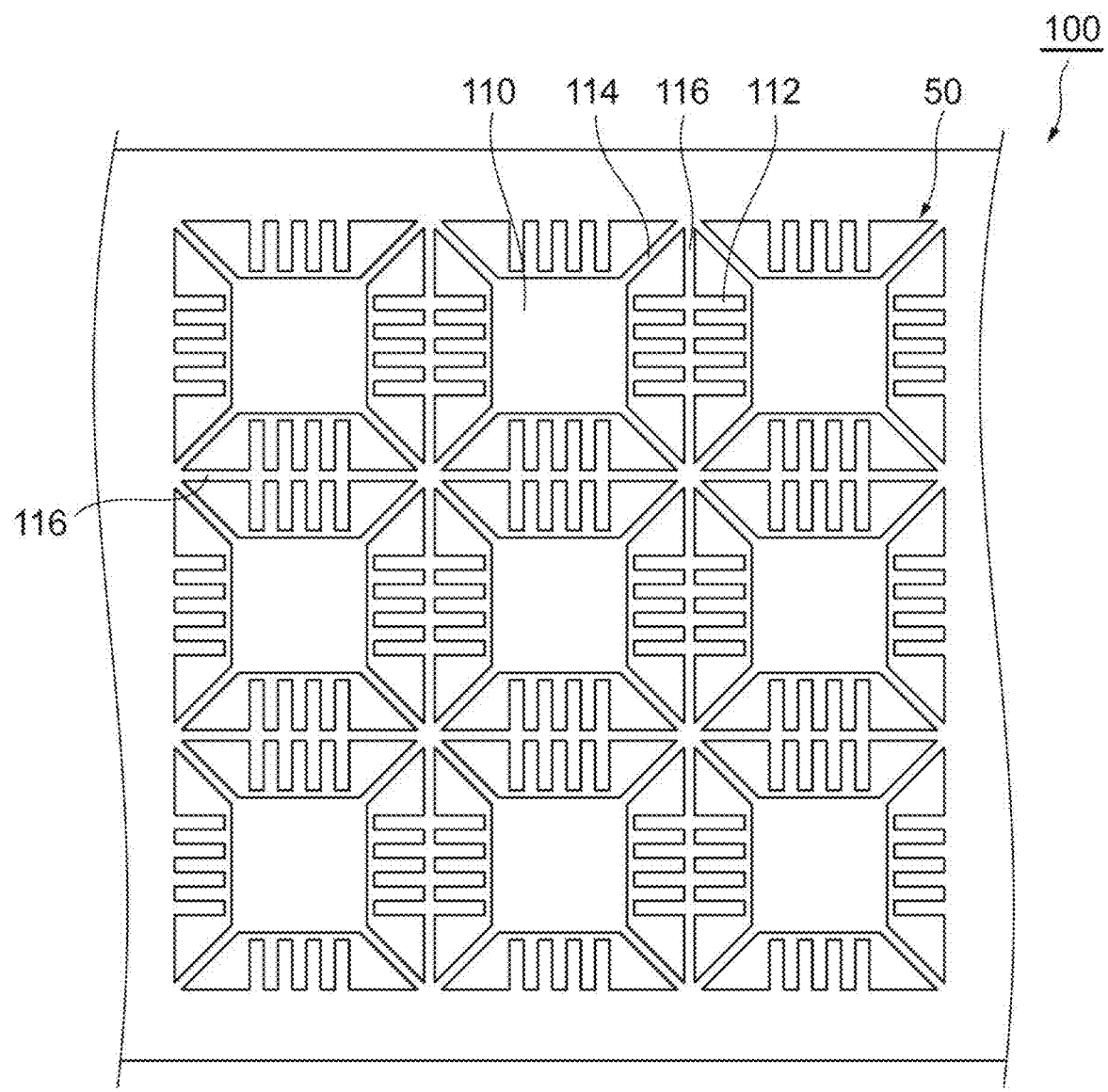
FIG. 1 is a plane view of a leadframe.

FIG. 1 is a plane view of a leadframe 100. A leadframe 100 has 9 (3 pieces x×3 pieces) unit frames 50. However, the number of unit frames 50 is not particularly limited. A unit frame 50 is connected with adjacent unit frames 50 through tie bars 116.

The leadframe 100 comprises a pad 110 disposed at the center, a plurality of leads 112 also called inner leads and disposed around the pad 110, and support bars 114 supporting the pad 110 in each unit frame 50. The front ends of the support bars 114 are connected with the pad 110, and the rear ends of the support bars 114 are connected with the tie bars 116 disposed around the leads 112. The support bars 114 extend radially from the four corners of a substantially rectangular pad 110, are connected with the tie bars 116, and support the pad 110 thereby.

Figure 2:
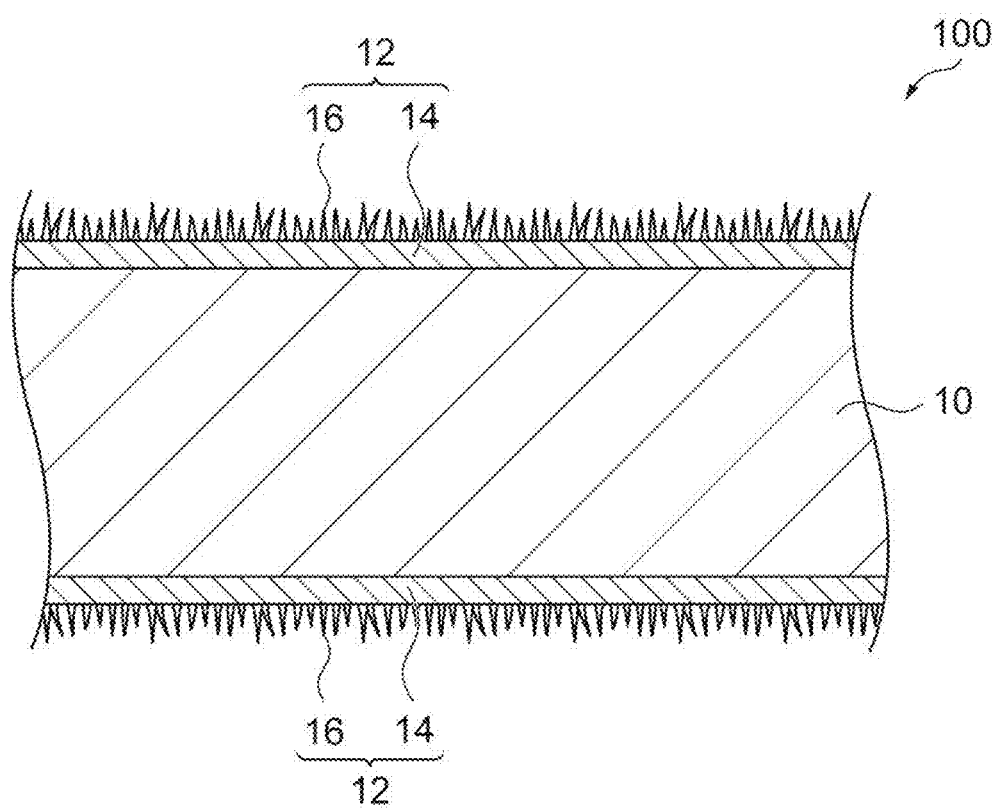
FIG. 2 is a sectional view showing a part of a section of a leadframe.

FIG. 2 is a sectional view showing a part of a section of the leadframe 100 shown in FIG. 1. The leadframe 100 comprises a substrate 10 and a surface layer 12 on the surface of the substrate 10. The surface layer 12 includes a copper plating film 14 and an acicular oxide 16 in this order from the substrate 10 side. The acicular oxide 16 binds to the copper plating film 14 at a base end. That is, the acicular oxide 16 extends from the copper plating film 14. Since the acicular oxide 16 has a large surface area and an anchor effect, the acicular oxide 16 can improve adhesion to a resin sufficiently.

The acicular oxide 16 is acicular crystals, and contains CuO as the main component. The number of hydrogen bonds with hydroxyl groups contained in the molecular structure of the resin can be increased sufficiently thereby. The acicular oxide 16 may contain $Cu_2O$. $Cu_2O$ can also form hydrogen bonds with hydroxyl groups contained in the molecular structure of the resin. The leadframe 100 thus enables maintaining the adhesion to the resin highly by physical and chemical bonds.

The atomic ratio (Cu/O) in the acicular oxide 16 may be 0.6 to 2.5, or may be 0.8 to 2.2. If the atomic ratio is such an atomic ratio, the ratio of copper oxide in the acicular oxide 16 is increased sufficiently, and the adhesion to the resin is further increased.

When observation is performed by mapping by EDX, the abundance of CuO is the highest of those of the components contained in the acicular oxide 16, and its abundance may be more than 50%. "CuO is contained as the main component" herein means that the abundance of CuO is thus the highest. The acicular oxide 16 may be substantially composed of only CuO, or only CuO and $Cu_2O$. "Substantially" mentioned here means that the other compounds are not detected by electron diffraction by TEM, atoms other than Cu and O (except atoms derived from measuring equipment) are not detected in EDX analysis.

In the acicular oxide 16, the tips of the acicular crystals may have a lower atomic ratio (Cu/O) than portions other than the tips (for example, base end). The ratio of oxygen atoms is high on the tips thereby, and the adhesion can be improved by increasing the number of hydrogen bonds with the resin. The ratio of copper atoms is high at the base end, and the bondability with the substrate 10 is good. Therefore, when the leadframe 100 is placed under a high temperature condition, heat stress which occurs near the interface between the surface layer 12 and the substrate 10 can be reduced. The occurrence of debonding by heat stress is therefore suppressed near the interface between the surface layer 12 and the substrate 10, and the reliability of the leadframe 100 can be further increased.

In the acicular crystals of the acicular oxide 16, the content of CuO of the tips may be higher than those of portions other than the tips. The effect of improving the adhesion to the resin by hydrogen bonds can be further increased thereby.

The surface layer 12 may contain an oxide film selected from the group consisting of an amorphous oxide film and a microcrystalline oxide film around the acicular oxide 16. The oxide film may contact the acicular oxide 16 (the acicular crystals). The oxide film may have the same composition as the acicular oxide 16. The oxide film contains, for example, CuO as the main components. The oxide film may further contain $Cu_2O$, and may be substantially composed of only CuO, or only CuO and $Cu_2O$. The oxide film also contributes to improvement in adhesion to the resin by forming hydrogen bonds with hydroxyl groups of the resin.

The thickness of the surface layer 12 may be, for example, 10 to 200 nm. The thickness of the surface layer 12 may be 30 nm or more from the viewpoint of further increase the adhesive force. The thickness of the surface layer 12 can be measured using a potentiostat.

The copper plating film 14 may be usual copper strike plating. Copper sulfate plating liquid used commonly can be used for copper strike plating. In other examples, the copper plating film 14 may not be disposed. When the surface layer 12 has the copper plating film 14, the material of the substrate 10 can be selected more freely. The substrate 10 may be composed of, for example, copper, a copper alloy, or 42 alloy material. The leadframe 100 may have a base plating layer between the substrate 10 and the copper plating film 14.

Figure 3:
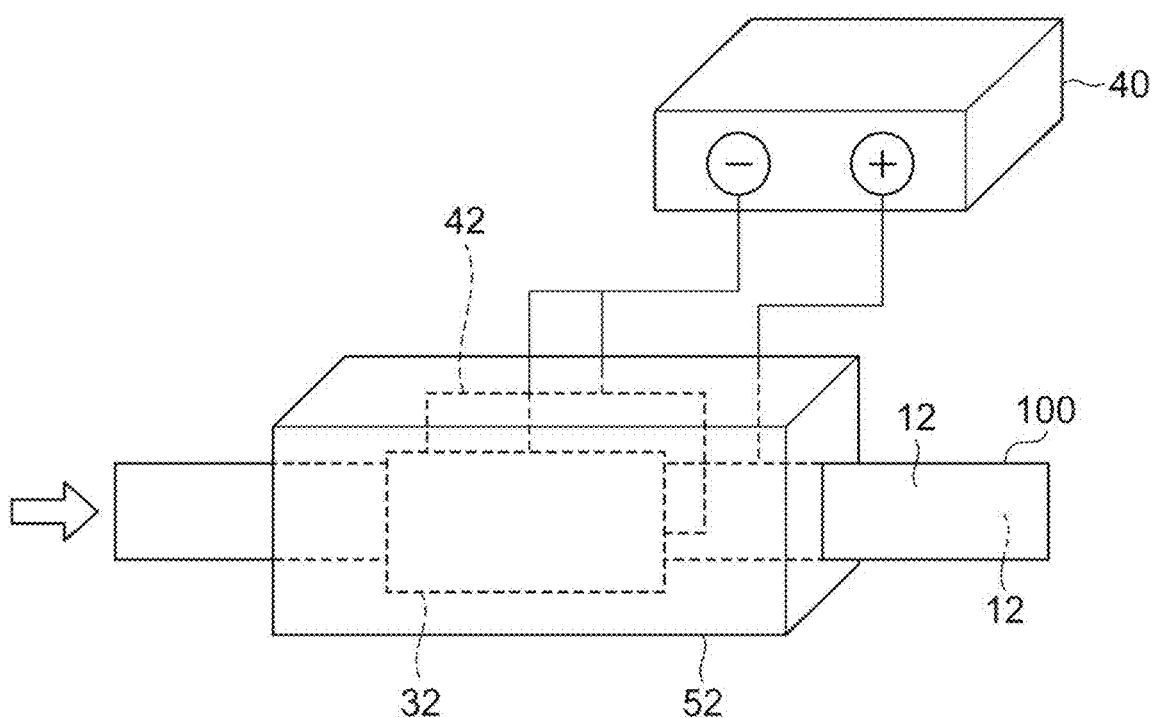
FIG. 3 is a figure showing an example of surface treatment device used for manufacturing a leadframe.

The surface layer 12 can be formed, for example, using a surface treatment device shown in FIG. 3. In the surface treatment device of FIG. 3, a substrate moves in an alkaline bath 52 in the temperature range of 60 to 80° C. from left to right in FIG. 3. Electrodes 32 and 42 are disposed in such a way as to be opposed to the respective paired principal surfaces of the substrate. The substrate and the electrodes 32 and 42 are connected to a power supply 40 so that the substrate is an anode and the electrodes 32 and 42 are cathodes. The power supply 40 is a direct-current power supply, and is configured to supply current, for example, at a current density of 0.1 to 1.5 A/dm². The treatment time of the substrate in the surface treatment device is, for example, 5 to 20 seconds. For example, a leadframe 100 can be obtained by surface-treating a substrate 10 having a copper plating film 14 with the surface treatment device.

The alkaline bath 52 contains, for example, sodium chlorite, sodium hydroxide, an amino compound, trisodium phosphate and ion-exchanged water. In the alkaline bath 52, for example, the following reactions (1) to (4) proceed.

[Chemical Formula 1]

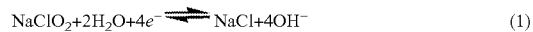   (1)

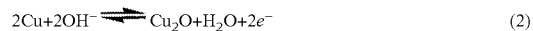   (2)

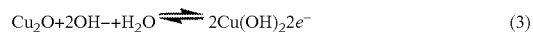   (3)

   (4)

As shown in formula (2), Cu contained in the substrate 10 reacts with hydroxide ions produced in formula (1) to produce $Cu_2O$. As shown in a formula 3), the produced $Cu_2O$ reacts with hydroxide ions to produce $Cu(OH)_2$. At this time, at least a part of $Cu_2O$ may remain in the acicular oxide 16 without reacting in formula (3). As shown in formula (4), $Cu(OH)_2$ produced in formula (3) reacts to produce CuO. Here, when formula (4) does not proceed sufficiently, a part of $Cu(OH)_2$ remains slightly, but in the present example, since the temperature of the alkaline bath 52 is 60 to 80° C., formula (4) proceeds sufficiently. As a result, the acicular oxide 16 is composed of CuO, or CuO and $Cu_2O$. It is preferable that the acicular oxide 16 do not contain copper hydroxide (II) substantially.

Figure 4:
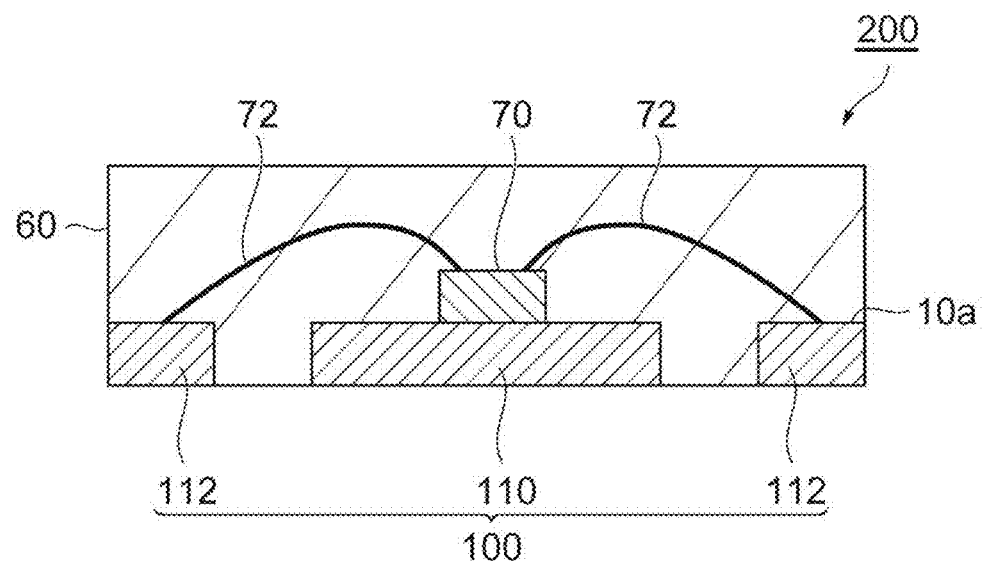
FIG. 4 is a sectional view showing an example of a leadframe package.

FIG. 4 is a sectional view showing an example of a leadframe package manufactured using the leadframe 100. The leadframe package 200 comprises the so-called QFN type of leadframe 100. The leadframe 100 has a pad 110 and leads 112 disposed around the pad 110. The leadframe package 200 comprises a leadframe 100, a semiconductor chip 70 disposed on the surface of the pad 110, bonding wires 72 connecting the semiconductor chip 70 and the leads 112, and a resin 60 sealing the semiconductor chip 70 and the bonding wires 72. The resin 60 is provided in such a way as to cover the semiconductor chip 70 and one surface of the leadframe 100. Meanwhile, the other surface of the leadframe 100 is not covered with the resin 60, but exposes itself to the outside.

The leadframe 100 has a surface layer containing an acicular oxide on one surface thereof. The acicular oxide contains CuO as the main component. Such a surface layer is stable even under a high temperature condition (for example, 200 to 300° C.), and sufficiently adhere to the resin 60. Therefore, the leadframe package 200 is excellent in reliability.

When the leadframe package 200 shown in FIG. 4 is mounted on a board such as a printed wiring board, the other surface at the leadframe 100 is connected to the conductor of the printed wiring board with solder. The leadframe 100 may have a surface layer also on the other surface thereof, or may have a surface layer only on one surface.

Next, one example of the method for manufacturing the leadframe package 200 will be described. This example comprises mounting a semiconductor chip 70 on one side surface of a leadframe 100, and scaling to provide a resin 60 in such a way as to seal the semiconductor chip 70 and cover one surface of the leadframe 100.

In the mounting, a resin for die bonding is used for the pad 110 of the leadframe 100, and the semiconductor chip 70 is fixed. Next, the pad of the semiconductor chip 70 and the leads 112 are connected through bonding wires 72. At this time, the bonding wires 72 are fixed using the resin for die bonding. The semiconductor chip 70 is thus mounted on the leadframe 100.

In the sealing, the leadframe 100 on which the semiconductor chip 70 is mounted is disposed in a molding metallic mold. Then, a resin composition (for example, a thermosetting resin composition such as an epoxy resin) is fed in the molding metallic mold. Then, the resin composition is heated and cured in the molding metallic mold to form a resin 60. A leadframe package 200 is thus obtained.

The leadframe package 200 enables maintaining the adhesion to the resin 60 enough satisfactorily under a high temperature condition. Therefore, the leadframe package 200 is excellent in reliability.

Although some examples were described above, the present disclosure is not limited to the above-mentioned examples at all. For example, the leadframe may be a DFN type or a QFP type.

EXAMPLES

Although the contents of the present disclosure will be described in detail with reference to Examples and Comparative Example, the present disclosure is not limited to the following Examples.

Example 1

Manufacturing of Leadframe

A substrate (Cu substrate) was provided. The substrate was subjected to electrolytic plating treatment to form a copper plating film (thickness: 0.1 μm) on the surface. Then, the substrate was anodized in alkaline liquid. An alkaline liquid containing sodium chlorite, sodium hydroxide, an amino compound, trisodium phosphate and ion-exchanged water was used. The substrate was moved in the alkaline liquid at 60 to 80° C. at a predetermined speed, and the surface treatment was performed at a current density of 0.8 to 1.1 $A/dm^2$ using a treatment unit as shown in FIG. 3. The retention time of the substrate in the alkaline liquid was 5 to 20 seconds.

An acicular oxide was formed on the surface of the copper plating film on the substrate by the above-mentioned surface treatment. The leadframe of Example 1 was thus obtained. The composition of the acicular oxide of the obtained leadframe was analyzed in the following procedure.

Analysis of Leadframe

STEM Image Observation, TEM Image Observation and EDX Analysis

A carbon protective film and a tungsten protective film were sequentially formed on the surface of the leadframe. The carbon protective film was formed using a high vacuum vapor deposition device, and the tungsten protective film was formed using an FIB device. The leadframe was processed by FIB micro-sampling, and flaked by FIB processing to obtain a measurement sample. A STEM image and a TEM image of the measurement sample were observed, and EDX analysis was performed.

Figure 5:
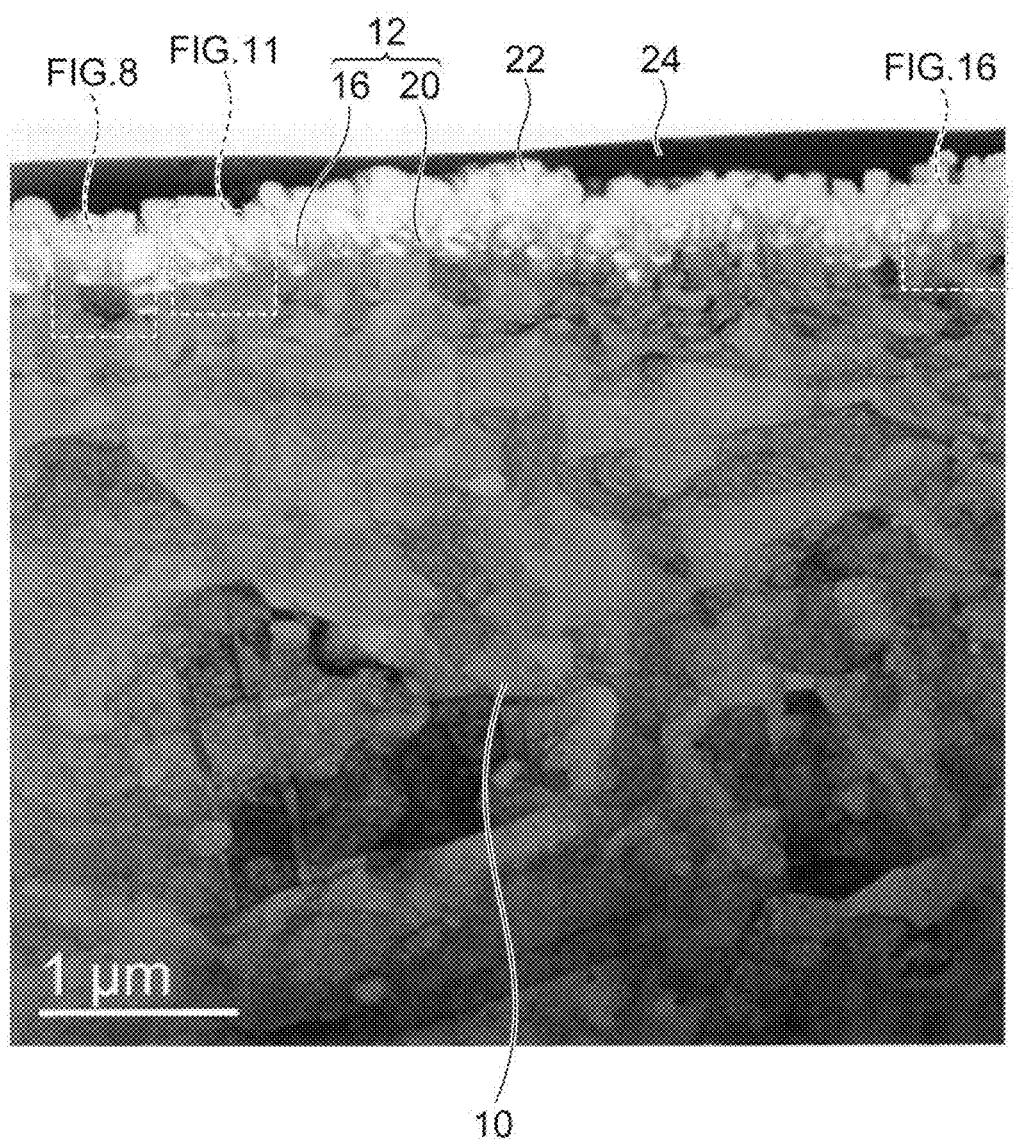
FIG. 5 is a photograph of a BF-STEM image of the leadframe of Example 1.

FIG. 5 shows a photograph of a BF-STEM image (magnification: 25000 times). As shown in FIG. 5, it was confirmed that the leadframe of Example 1 includes a surface layer 12 containing an acicular oxide 16 and an oxide film 20 adhering to the acicular oxide. 16. A carbon protective film 22 and a tungsten protective film 24 cover the surface layer 12 of the leadframe in this order.

Figure 6:
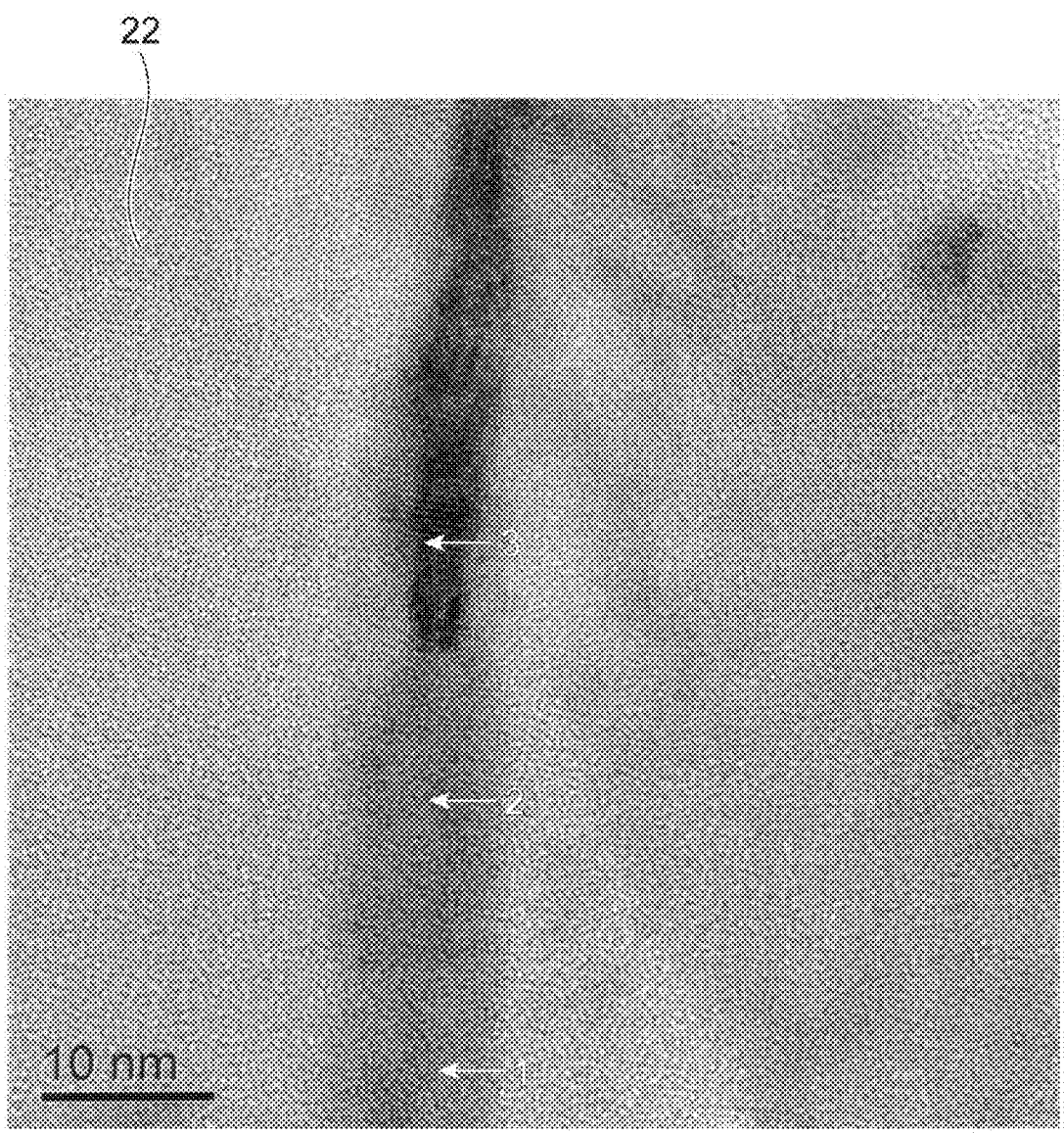
FIG. 6 is a TEM photograph of a magnified image of the acicular oxide of Example 1.

FIG. 6 is a TEM photograph of a magnified image of the acicular oxide (magnification: 350000 times). EDX analysis was performed in the point 1, the point 2 and the point 3 of FIG. 6. The point 3 is located at the tip of the acicular crystals included in the acicular oxide, and the points 1 and 2 are located at the base end side of the point 3. An EDX analysis device (device name: JED-2300T) manufactured by JEOL Ltd. was used for EDX analysis. The accelerating voltage was 200 kV, and the beam diameter was about 1 nm.

Figure 7:
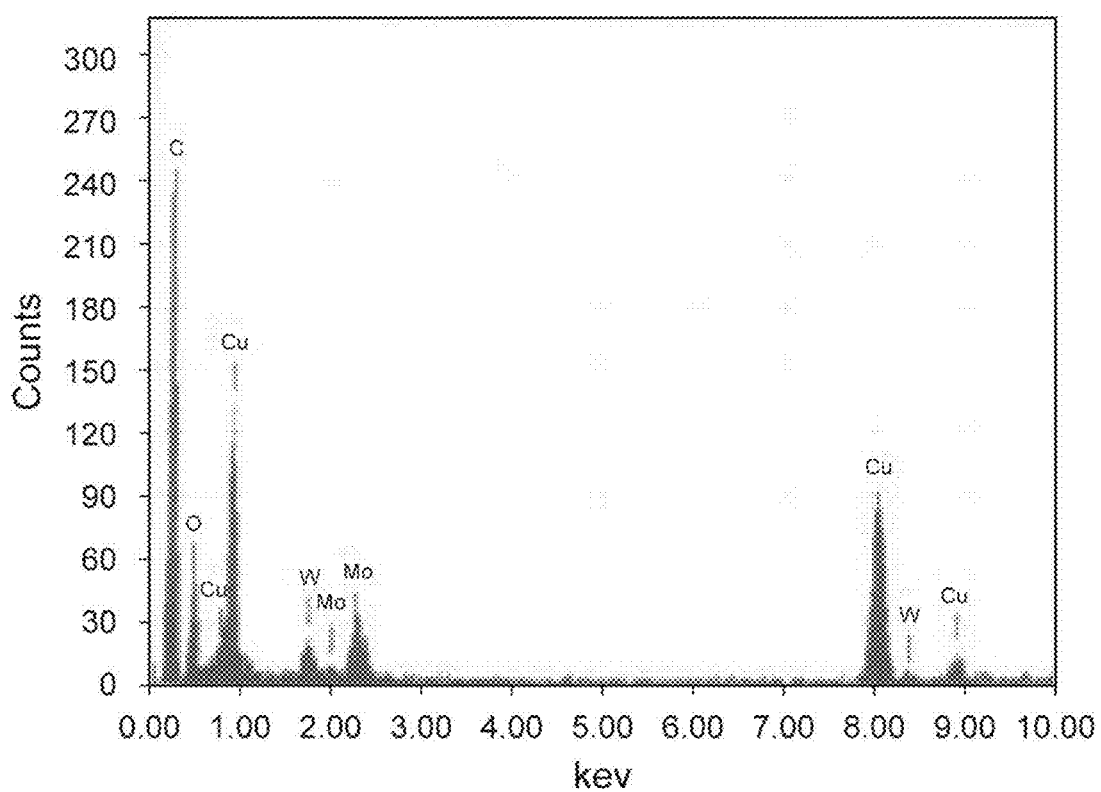
FIG. 7 is a chart showing an EDX analysis result of the acicular oxide of Example 1.

FIG. 7 is a chart showing an EDX analysis result at the point 3 of FIG. 6. In FIG. 7, C is a peak derived from a protective film, and the peaks of Mo are peaks derived from a mesh for retaining the sample. As shown in FIG. 7, only Cu and O were detected in the acicular oxide. Also, at the points 1 and 2 of FIG. 6, only Cu and O were detected in the same way as FIG. 7. The semi-quantitative results of Cu and O at the points 1, 2 and 3 based on EDX analysis results are shown in Table 1. According to the results of Table 1, the value of Cu/O at the tip of the acicular crystal was smaller than the values at portions other than the tip.

TABLE 1

| Point | O | Cu | Cu/O |
|---|---|---|---|
| 1 | 39.5 | 60.5 | 1.53 |
| 2 | 31.6 | 68.4 | 2.16 |
| 3 | 50.9 | 49.1 | 0.96 |

Figure 8:
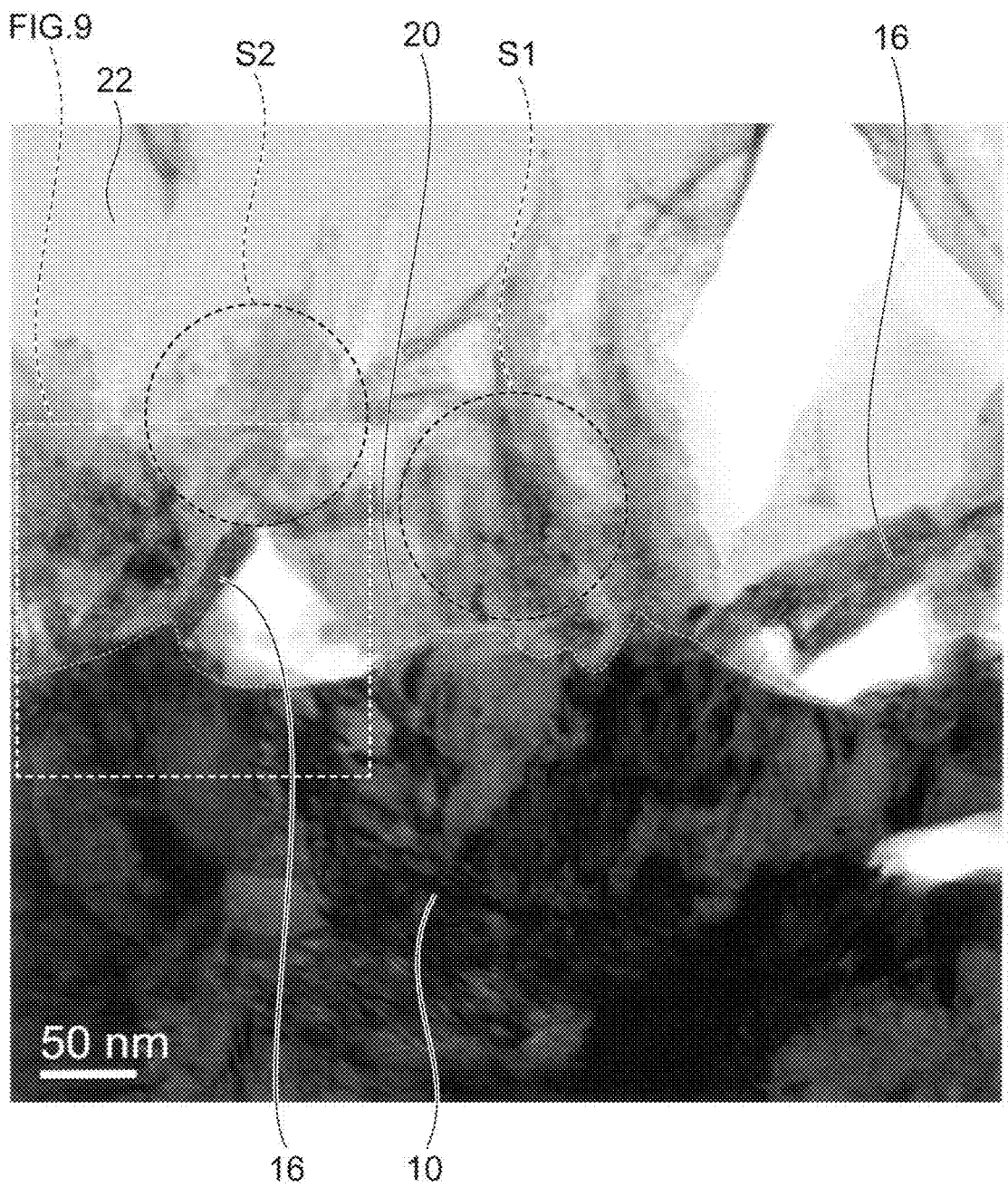
FIG. 8 is a TEM photograph of the acicular oxide of Example 1.
Figure 9:
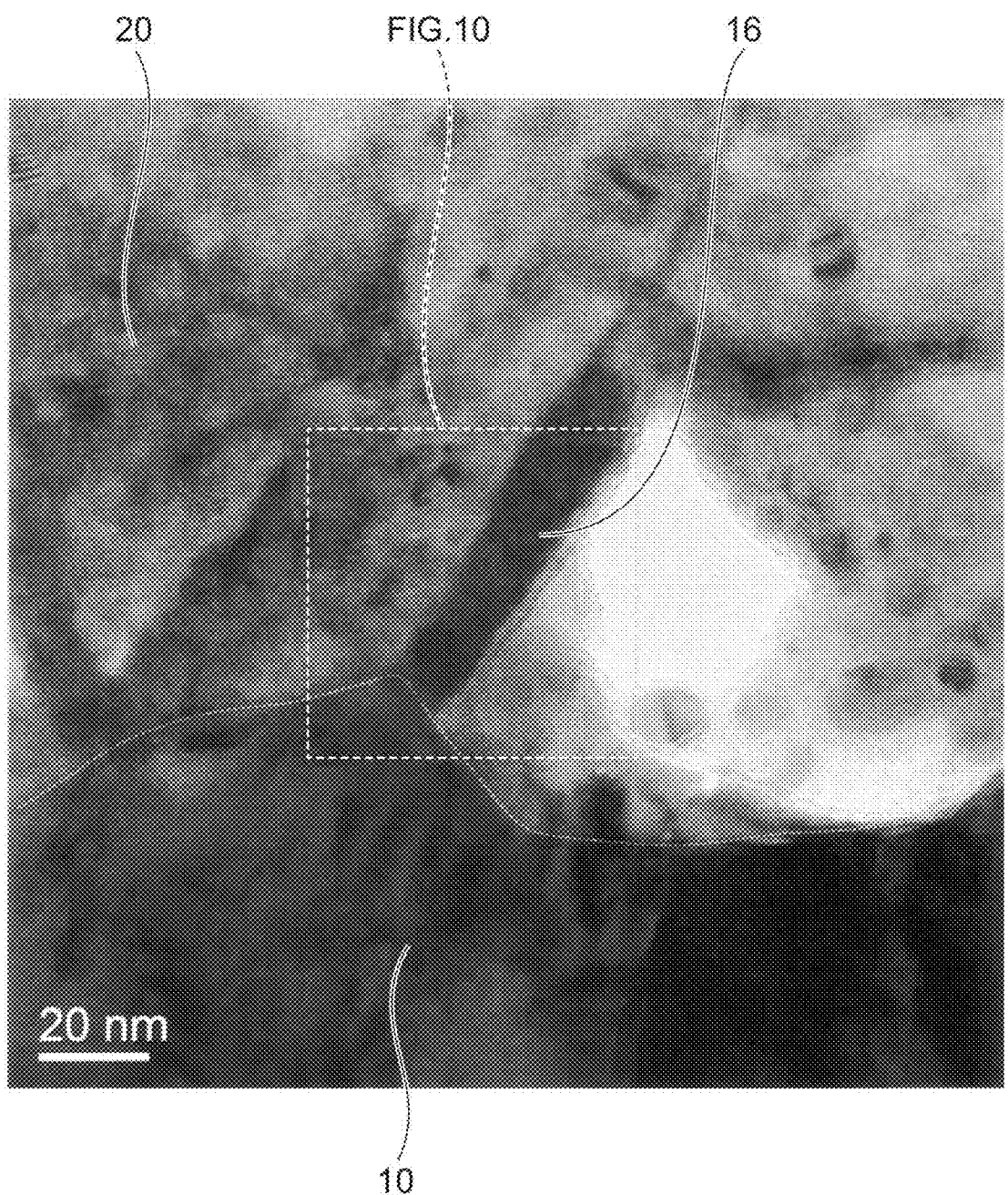
FIG. 9 is a TEM photograph of the acicular oxide of Example 1.
Figure 10:
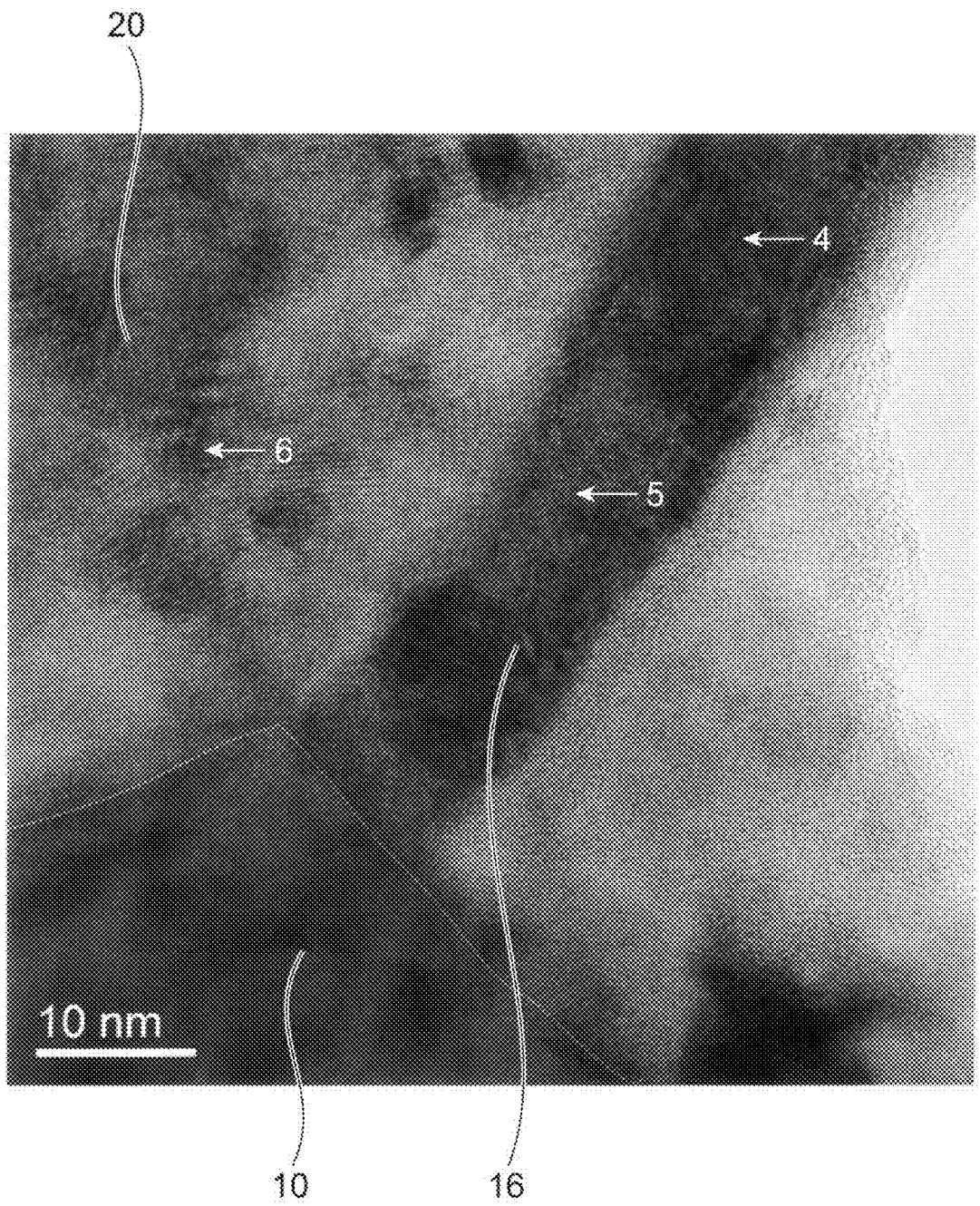
FIG. 10 is a TEM photograph of the acicular oxide of Example 1.

FIG. 8 is a TEM photograph of a magnified image of the acicular oxide 16 at a portion different from portions shown in FIG. 6 and FIG. 7 (magnification: 350000 times). FIG. 9 is a TEM photograph of a magnified image of a portion covered by the acicular oxide 16 in FIG. 8 (magnification: 1000000 times). FIG. 10 is a TEM photograph of an image further magnifying and showing the acicular oxide 16 included in the photograph of FIG. 9 (magnification: 3000000 times). As shown in FIG. 8 to FIG. 10, the surface layer of the leadframe contained the acicular oxide 16 and an oxide film 20 therearound. EDX analysis was performed at the points 4, 5 and 6 of FIG. 10. The point 4 is located nearer to the tip than the point 5 in the acicular oxide 16.

Also, at the points 4, 5 and 6 of FIG. 10, Cu and O were detected in the same way as FIG. 7. The semi-quantitative results of Cu and O at the points 4, 5 and 6 based on these analysis results are shown in Table 2. According to the results of the points 4 and 5 of Table 2, the value of Cu/O on the tip side of the acicular crystal was smaller than that on the base end side. Only the peaks of Cu and O were detected in the same way as FIG. 7, and it was confirmed that CuO was contained as the main component also at the point 6 showing the composition of the oxide film 20.

TABLE 2

| Point | O | Cu | Cu/O |
|---|---|---|---|
| 4 | 46.1 | 53.9 | 1.17 |
| 5 | 41.8 | 58.2 | 1.39 |
| 6 | 46.5 | 53.5 | 1.15 |

Figure 11A:
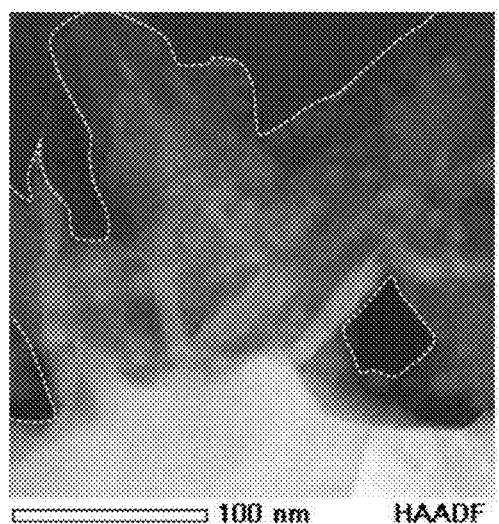
FIG. 11A is an HAADF-STEM image of a part corresponding to FIG. 9.
Figure 11B:
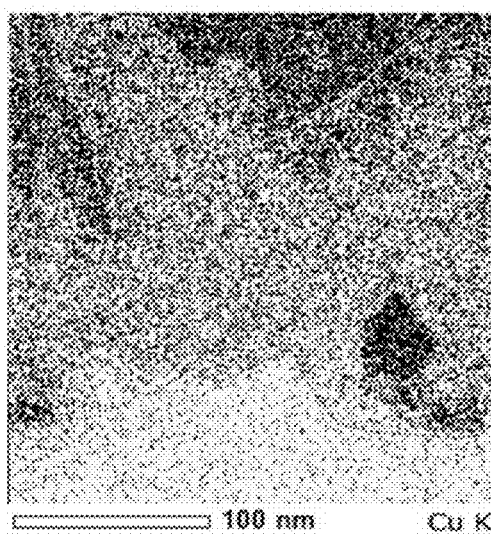
FIG. 11B and FIG. 11C show the results of EDX mapping of Cu (K) and O (K) in the same part.
Figure 11C:
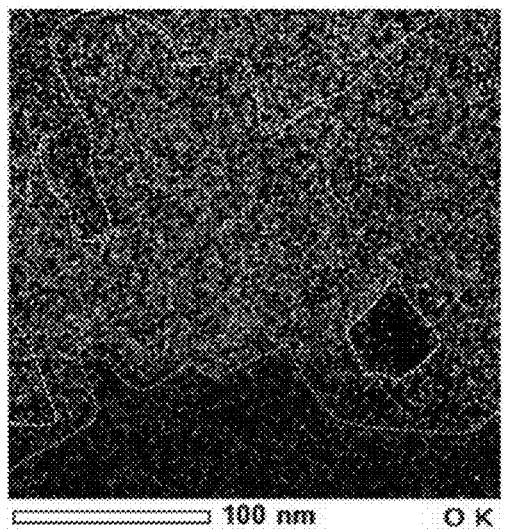

FIG. 11A is a HAADF-STEM image of a portion corresponding to FIG. 9. FIG. 11B and FIG. 11C show the results of EDX mapping of Cu(K) and O(K) in the same portion. As shown in FIG. 11A, a surface layer has acicular oxide and an oxide film adhering to the acicular oxide. According to the result of EDX mapping, the compositions of almost all the acicular oxide and the oxide film were near the composition of CuO, and were a comparatively uniform composition. The acicular oxide and the oxide film thus contained CuO as the main component.

Figure 12:
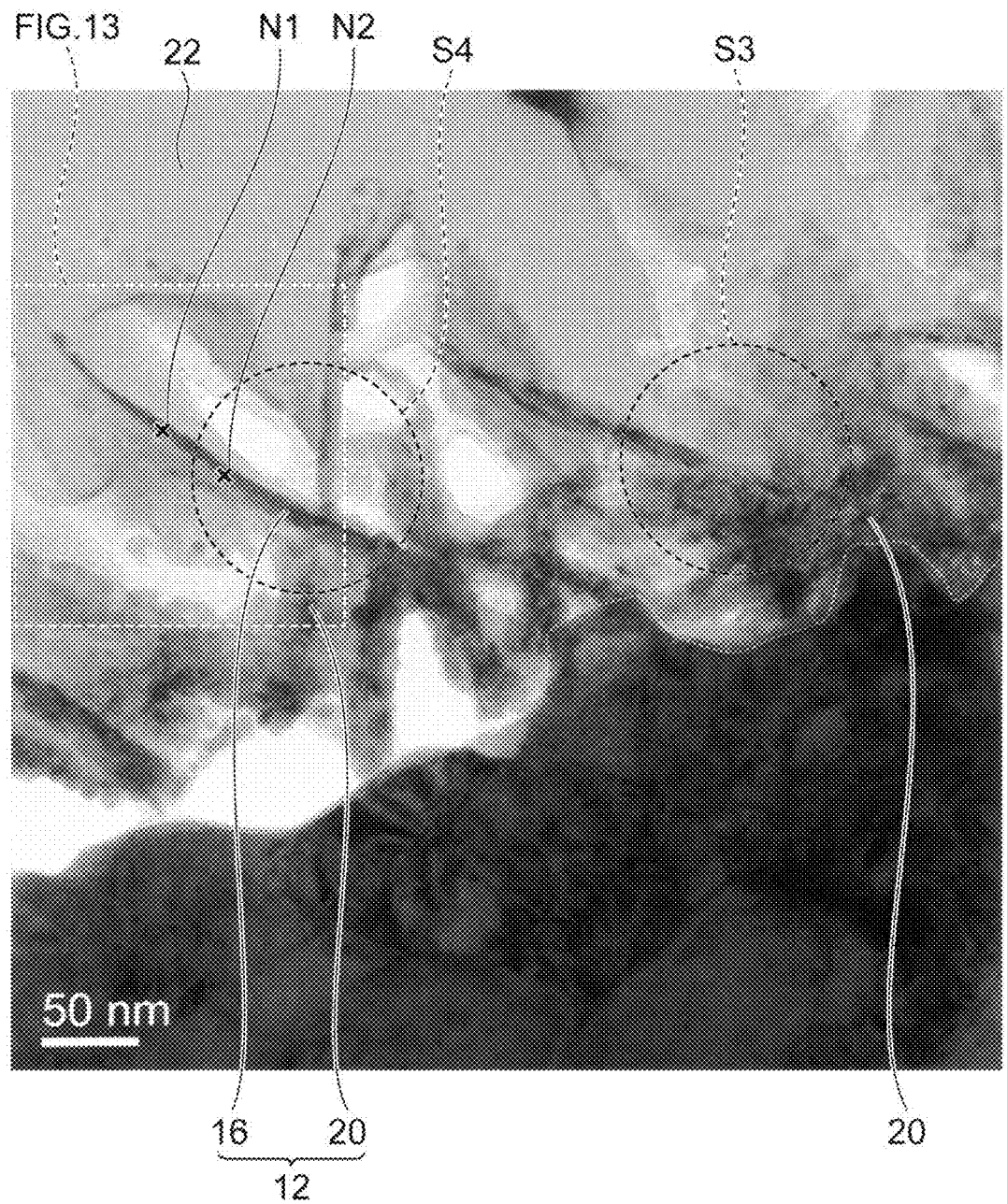
FIG. 12 is a TEM photograph of the acicular oxide of Example 1.

FIG. 12 is a TEM photograph of a magnified image in yet another portion of the acicular oxide 16 (magnification: 350000 times).

Figure 13:
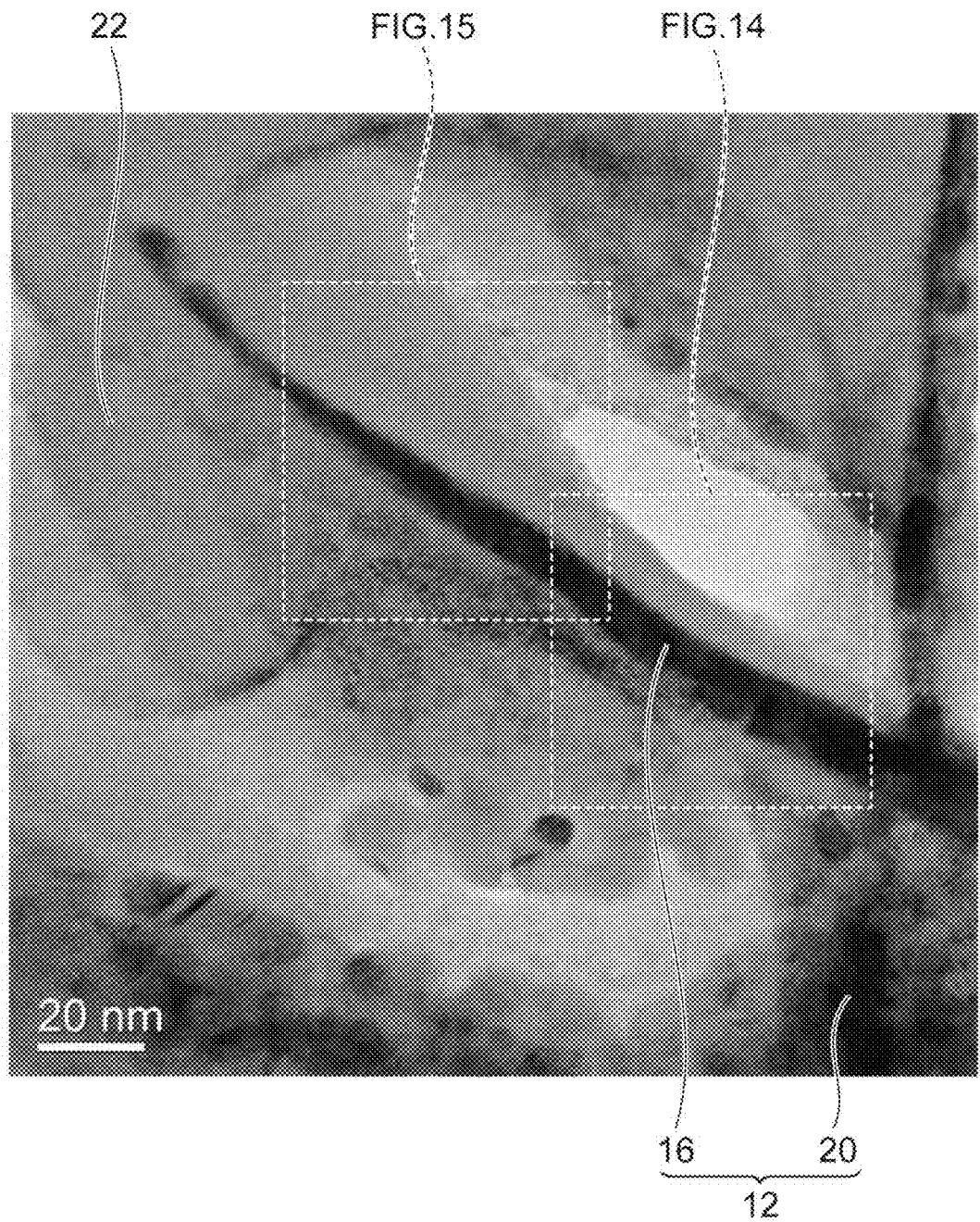
FIG. 13 is a TEM photograph of the acicular oxide of Example 1.
Figure 14:
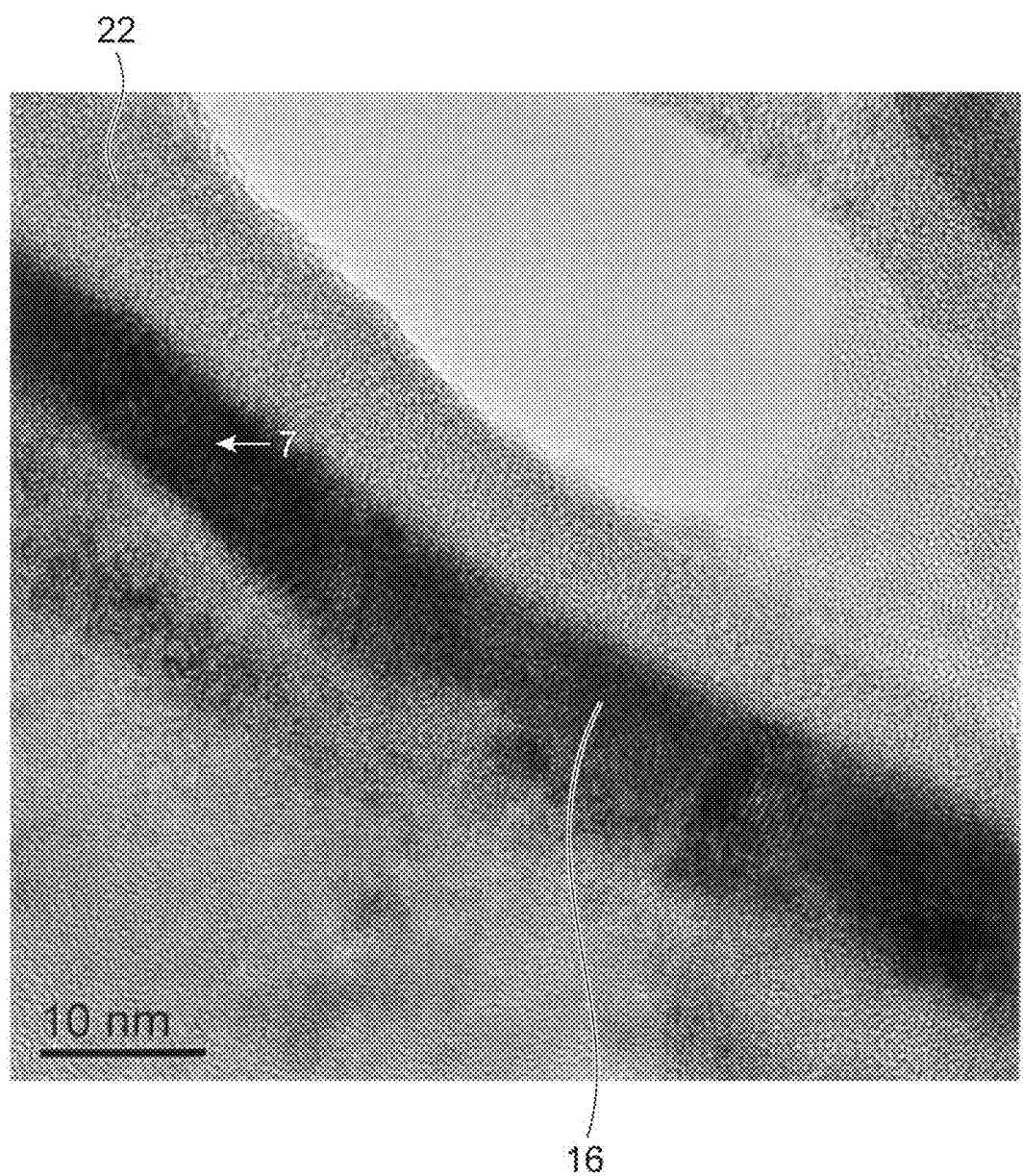
FIG. 14 is a TEM photograph of the acicular oxide of Example 1.
Figure 15:
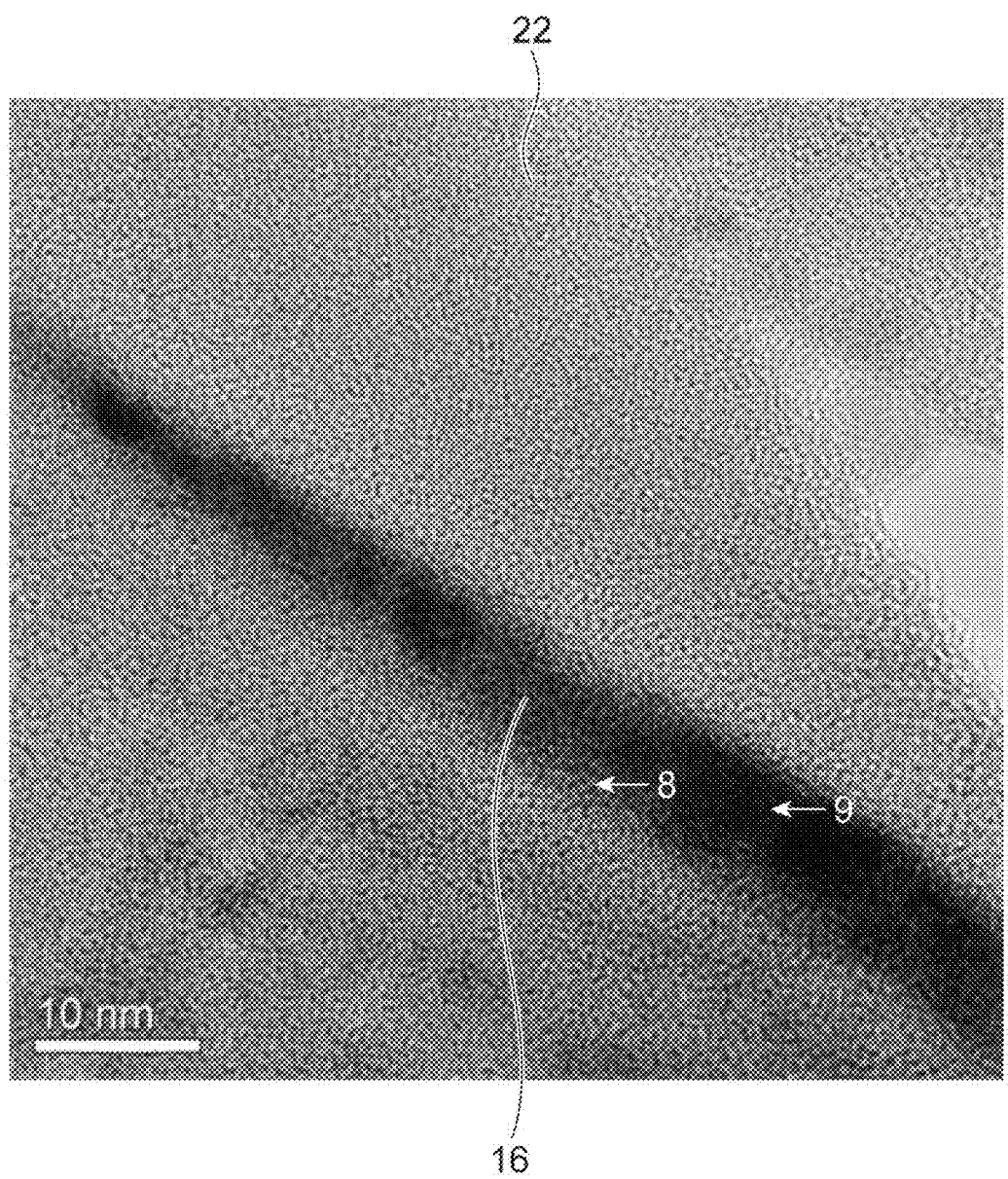
FIG. 15 is a TEM photograph of the acicular oxide of Example 1.

FIG. 13 is a TEM photograph of an image further magnifying and showing a part of the acicular oxide 16 shown in FIG. 12 (magnification: 1000000 times). FIG. 14 and FIG. 15 are TEM photographs of images further magnifying and showing a part of the acicular oxide 16 shown in the photograph of FIG. 13 (magnification: 3000000 times). As shown in FIG. 12 to FIG. 15, the surface layer 12 of the leadframe contained the acicular oxide 16 and the oxide film 20 therearound. EDX analysis was performed at the point 7 of FIG. 14 and the points 8 and 9 of FIG. 15. Among the points 7, 8 and 9, the point 7 is located nearest to the base end, and the point 8 is located nearest to the tip.

Also, at the points 7, 8, and 9, only Cu and O were detected in the same way as FIG. 7. The semi-quantitative results of Cu and O at the points 7, 8 and 9 based on these analysis results are shown in Table 3. Also, in Table 3, the value of Cu/O at the tip of the acicular crystal was smaller than the values at portions other than the tip.

TABLE 3

| Point | O | Cu | Cu/O |
|---|---|---|---|
| 7 | 35.1 | 64.9 | 1.85 |
| 8 | 45.0 | 55.0 | 1.22 |
| 9 | 43.6 | 56.4 | 1.29 |

Figure 16:
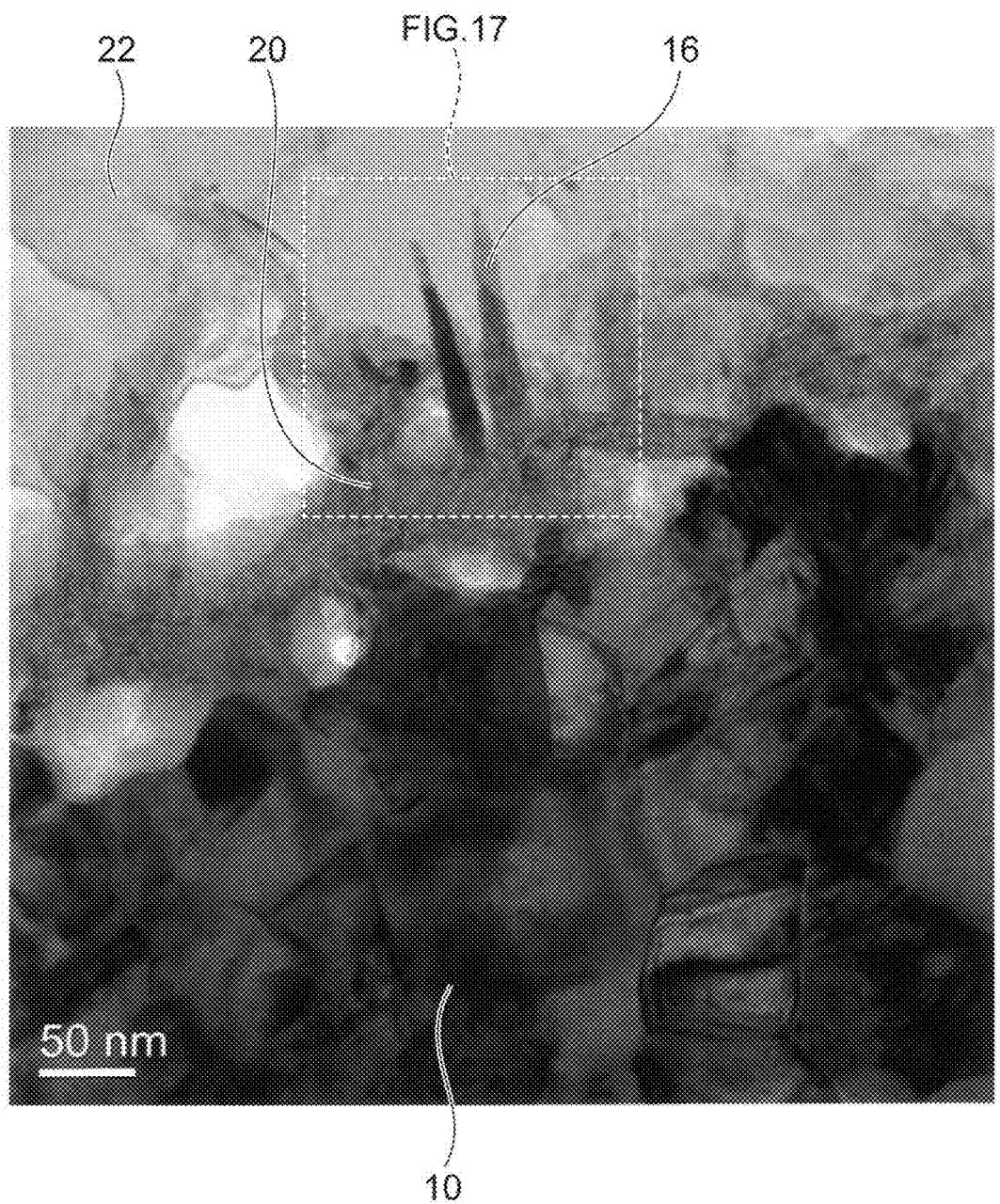
FIG. 16 is a TEM photograph of the acicular oxide of Example 1.
Figure 17:
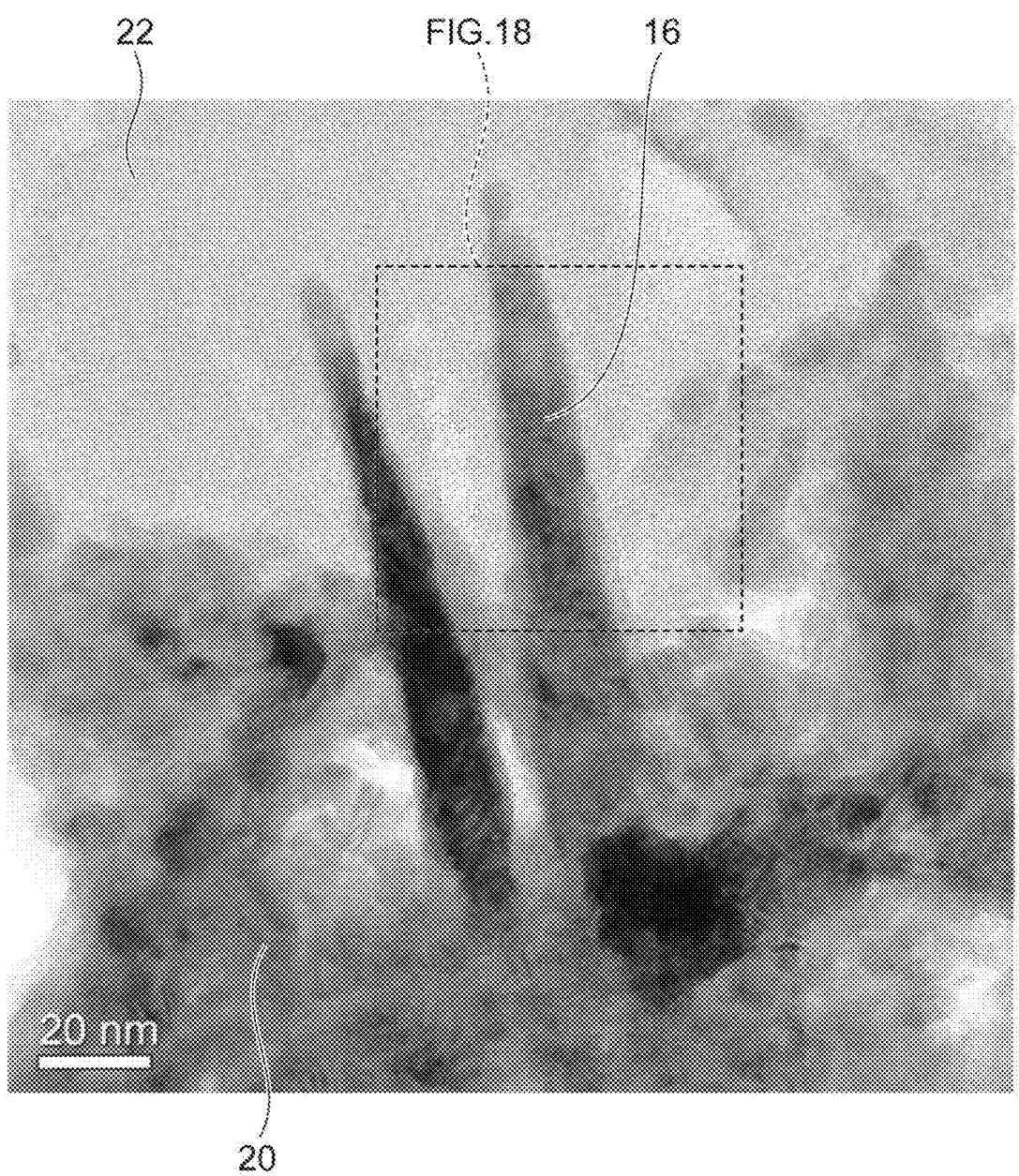
FIG. 17 is a TEM photograph of the acicular oxide of Example 1.
Figure 18:
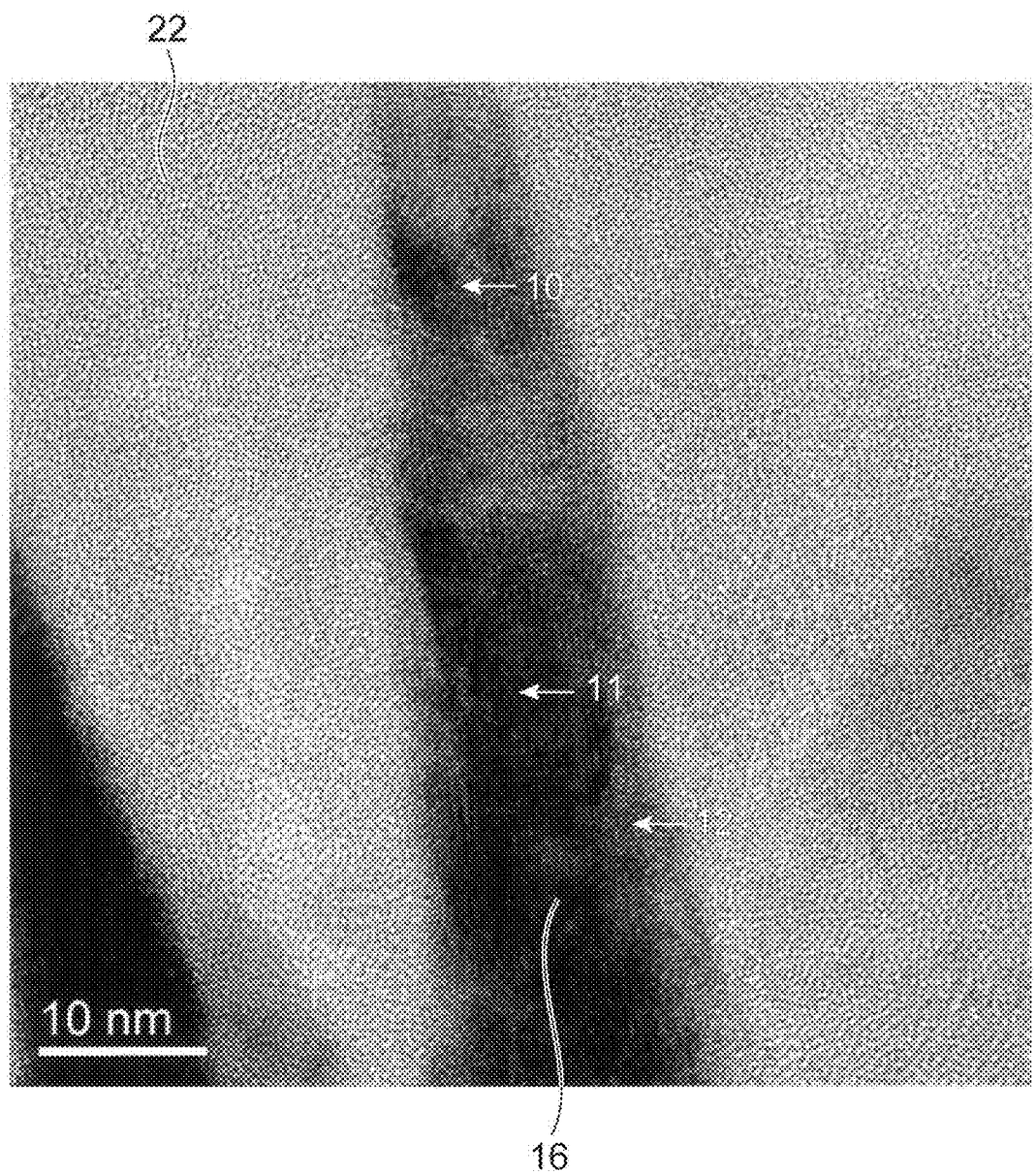
FIG. 18 is a TEM photograph of the acicular oxide of Example 1.

FIG. 16 is a TEM photograph of a magnified image at yet another portion of the acicular oxide 16 (magnification: 350000 times). FIG. 17 shows a TEM photograph of an image further magnifying and showing a part of the acicular oxide 16 shown in FIG. 16 (magnification: 1000000 times). FIG. 18 shows a TEM photograph of an image further magnifying and showing a part of the acicular oxide 16 shown in the photograph of FIG. 17 (magnification: 3000000 times). As shown in FIG. 16 to FIG. 18, the surface layer of the leadframe contained the acicular oxide 16 and the oxide film 20 therearound. EDX analysis was performed at the points 10, 11 and 12 of FIG. 1$. Among the points 10, 11, and 12, the point 10 is located at the tip, and the points 11 and 12 are located at portions other than the tip.

As a result of EDX analysis, only Cu and O were detected also at the points 10, 11, and 12 in the same way as FIG. 7. The semi-quantitative results of Cu and O at the points 10, 11 and 12 based on these analysis results are shown in Table 4. As shown in Table 4, the value of Cu/O at the tip or the acicular crystal was smaller than the values at portions other than the tip.

TABLE 4

| Point | O | Cu | Cu/O |
|---|---|---|---|
| 10 | 52.1 | 47.9 | 0.92 |
| 11 | 39.4 | 60.6 | 1.54 |
| 12 | 44.9 | 55.1 | 1.23 |

Electron Diffraction Analysis

Selected area electron diffraction was performed in the regions of "S1" and "S2" shown in FIG. 8, and "S3" and "S4" shown in FIG. 12. Diffraction patterns in the selected areas of S1 to S4 are shown in FIG. 19A to FIG. 19D respectively. The interplanar spacings were measured from the obtained Debye rings. The measurement results are summarized in Table 5. As shown in Table 5, all the interplanar spacings approximately correspond with the theoretical values of the interplanar spacings of CuO and $Cu_2O$. From these results, it was confirmed that the acicular oxide contained CuO and $Cu_2O$. Meanwhile, diffraction spots corresponding to the Miller indices <020> and <021> of $Cu(OH)_2$ were not confirmed.

TABLE 5

Figure 19A:
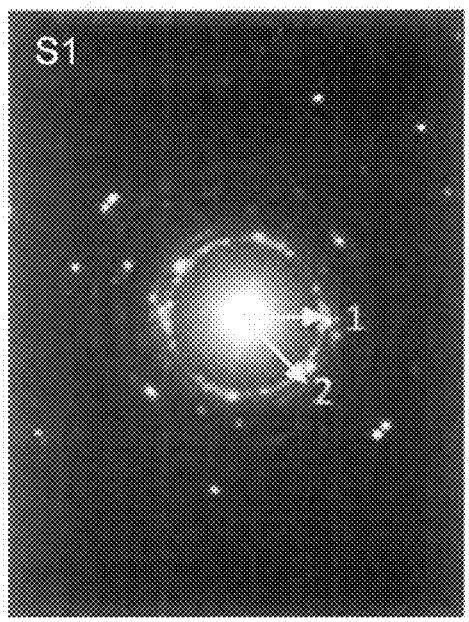
FIG. 19A is the diffraction pattern of electron diffraction in the "S1" of FIG. 8.
Figure 19B:
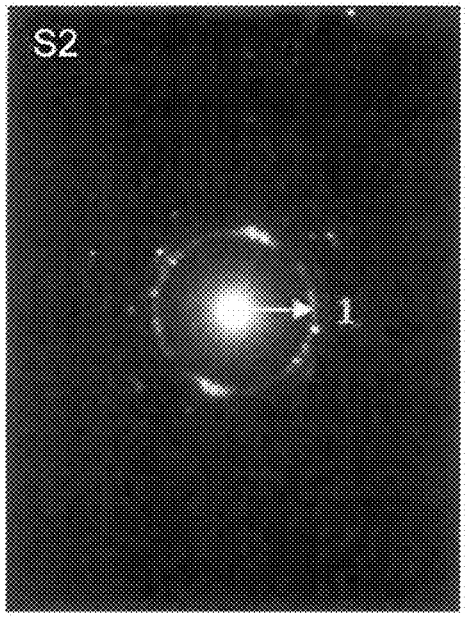
FIG. 19B is the diffraction pattern of electron diffraction in the "S2" of FIG. 8.

| FIG. NO. | Number | Interplanar spacing [nm] (found) | Interplanar spacing [nm] (calculated) | Miller index |
|---|---|---|---|---|
| FIG. 19A | 1 | 0.237 | 0.2312 | 111 (CuO) |
|  |  |  | 0.2295 | 200 (CuO) |
|  | 2 | 0.200 | 0.1952 | 11-2 (CuO) |
| FIG. 19B | 1 | 0.233 | 0.2312 | 111 (CuO) |

TABLE 5-continued

Figure 19C:
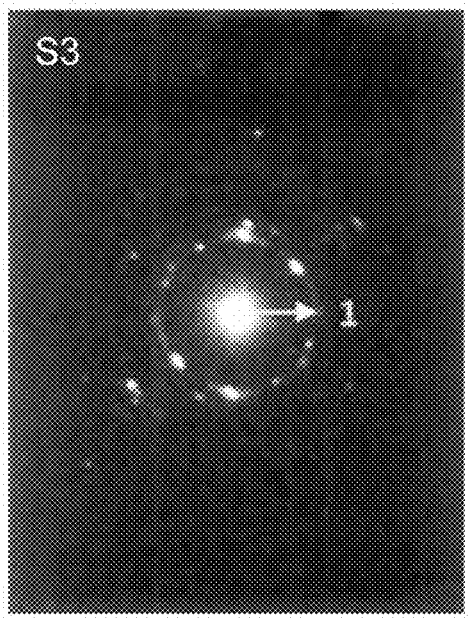
FIG. 19C is the diffraction pattern of electron diffraction in the "S3" of FIG. 12.
Figure 19D:
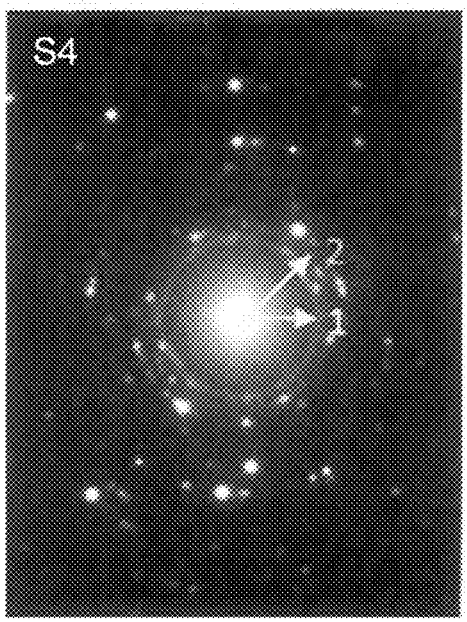
FIG. 19D is the diffraction pattern of electron diffraction in the "S4" of FIG. 12.

| FIG. NO. | Number | Interplanar spacing [nm] (found) | Interplanar spacing [nm] (calculated) | Miller index |
|---|---|---|---|---|
| | | | 0.2295 | 200 (CuO) |
| FIG. 19C | 1 | 0.231 | 0.2312 | 111 (CuO) |
| | | | 0.2295 | 200 (CuO) |
| FIG. 19D | 1 | 0.248 | 0.2520 | 002 (CuO) |
| | | | 0.2511 | 11-1 (CuO) |
| | | | 0.2465 | 111 (Cu$_2$O) |
| | 2 | 0.210 | 0.2135 | 200 (Cu$_2$O) |

Nano Electron Diffraction

Figure 20A:
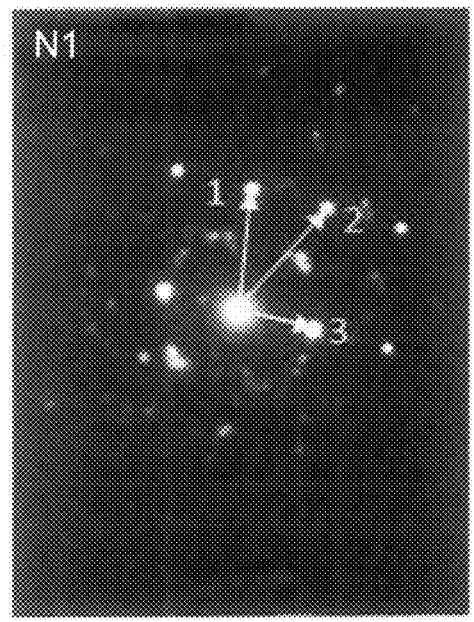
FIG. 20A is the diffraction pattern of selected area nano electron diffraction in "N1" shown in FIG. 12.
Figure 20B:
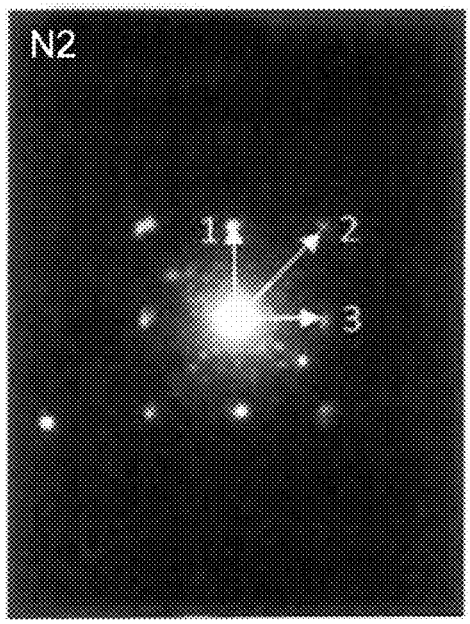
FIG. 20B is the diffraction pattern of selected area nano electron diffraction in "N2" shown in FIG. 12.
Figure 20C:
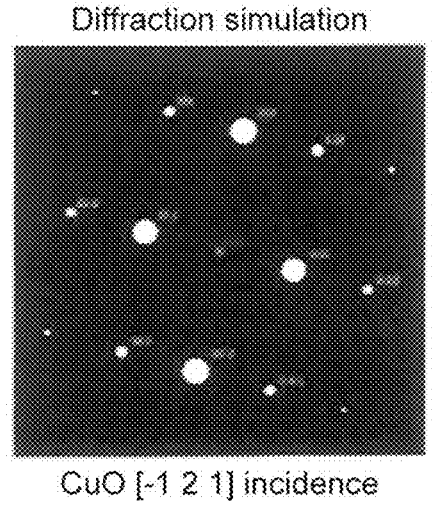
FIG. 20C is the diffraction simulation results of the Miller index <-121> of CuO.
Figure 20D:
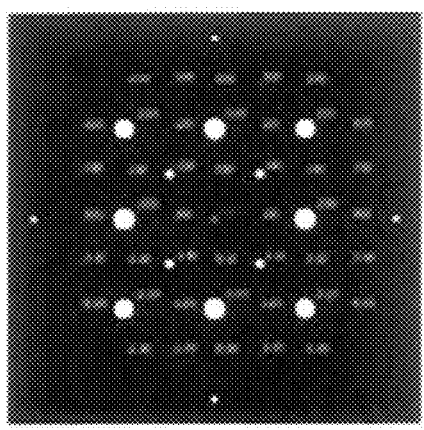
FIG. 20D is the diffraction simulation results of the Miller index <001> of CuO.

Selected area nano electron diffraction was performed at locations of "N1" and "N2" shown in FIG. 12. The nano electron diffraction patterns in the selected areas "N1" and "N2" are shown in FIG. 20A and FIG. 20B. The diffraction simulation results of the Miller index <–121> of CuO and the Miller index <001> of Cu$_2$O were shown in FIG. 20C and FIG. 20D. The interplanar spacings were measured from the obtained nano electron diffraction patterns. The measurement results are summarized in Table 6. As shown in Table 6, all the interplanar spacings approximately agree with the theoretical values of the interplanar spacings of CuO and Cu$_2$O. From these results, it was confirmed that the acicular oxide contained CuO and Cu$_2$O.

TABLE 6

| FIG NO. | Number | Interplanar spacing [nm] (found) | Interplanar spacing [nm] (calculated) | Miller index |
|---|---|---|---|---|
| | 1 | 0.161 | 0.1572 | 202 (CuO) |
| FIG. 20A | 2 | 0.142 | 0.1373 | 1-13 (CuO) |
| | 3 | 0.252 | 0.2511 | -1-11 (CuO) |
| | 1 | 0.210 | 0.2135 | 020 (Cu$_2$O) |
| FIG. 20B | 2 | 0.152 | 0.1510 | 220 (Cu$_2$O) |
| | 3 | 0.214 | 0.2135 | 200 (Cu$_2$O) |

Measurement of Thickness and Shear Strength of Surface Layer

The thickness of the surface layer of the leadframe of Example 1 was measured using a potentiostat (trade name: HSV-100 (manufactured by HOKUTO DENKO CORPORATION)). As a result, the thickness of the surface layer was 63 nm. A silicon chip was mounted on the pad of the leadframe through adhesive. Then, the shear strength at the time of peeling the silicon chip from the pad while heating in the air atmosphere at 260° C. was measured using a 4000Plus bond tester (manufactured by Nordson Dage). The shear speed was 100 μm/s, and the shear height was 100 μm. When measurement was performed at n=12, the average value of the shear strength was 5.81 MPa.

Comparative Example 1

The same substrate (Cu substrate) as the substrate used in Example 1 was provided. The substrate was subjected to electrolytic plating treatment in the same way as in Example 1 to form a copper plating film (thickness: 0.1 μm) on the surface. This was used as the leadframe of Comparative Example 1.

The thickness of the surface layer (copper plating film) of the leadframe of Comparative Example 1 was measured using the potentiostat in the same way as in Example 1. As a result, the thickness of the surface layer was 1.9 mm. A silicon chip was mounted on the pad of the leadframe through adhesive. Then, the shear strength at the time of peeling the silicon chip while heating in the air atmosphere at 260'C. was measured by the same method as Example 1. When measurement was performed at n=12, the average value of the shear strength was 1.73 MPa. It was confirmed that Example 1 has much higher shear strength than Comparative Example 1.

Example 2

Figure 21:
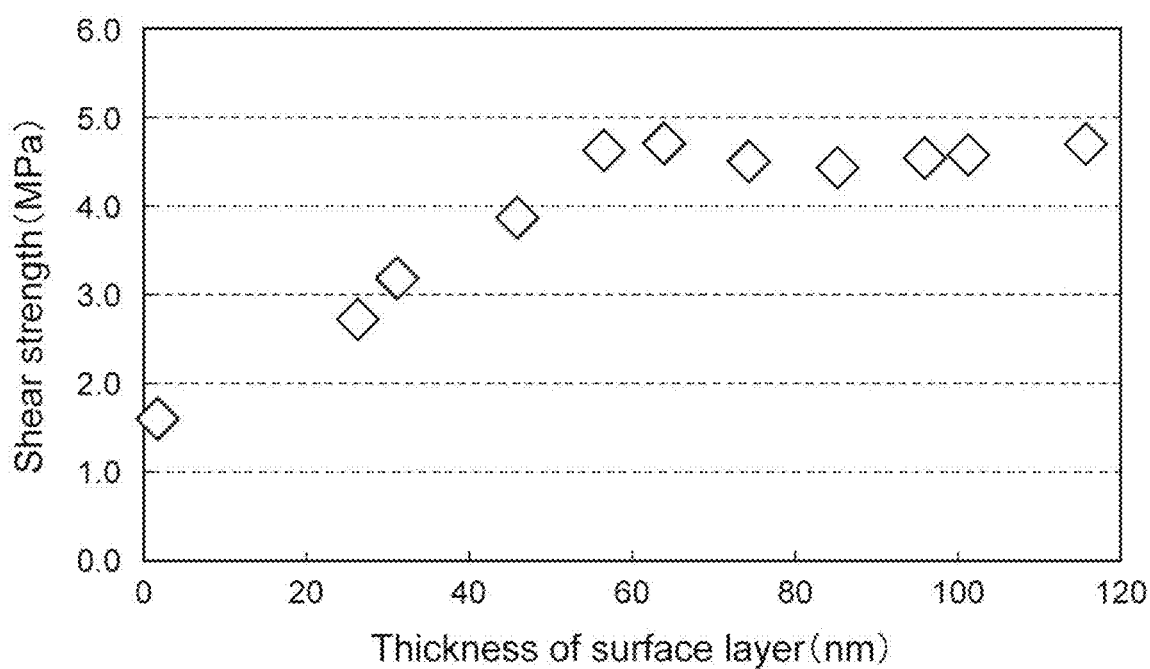
FIG. 21 is a graph showing the relationship between the thickness of a surface layer and the shear strength in Example 2.

In the same procedure as in Example 1, a plurality of leadframes wherein the thicknesses of the surface layers were different were manufactured. The thickness of the surface layer was changed by adjusting the current density of surface treatment. The thickness of the surface layer was measured using the potentiostat. The shear strength of each leadframe was measured in the same way as Example 1. The relationship between the thickness of the surface layer and the shear strength is shown in FIG. 21, In FIG. 21, the shear strengths of Comparative Example 1 and Example 1 were also plotted. From this result, it was confirmed that the shear strength can be increased sufficiently by increasing the thickness of the surface layer.

The invention claimed is:

1. A leadframe comprising:
   a substrate; and
   a surface layer covering the substrate,
   wherein the surface layer includes a copper plating film bound to acicular oxide crystals, the acicular oxide crystals containing CuO at a higher concentration than any other component of the acicular oxide crystals, and
   wherein the copper plating film is located between the acicular oxide crystals and the substrate, the acicular oxide crystals directly contacting the copper plating film.

2. The leadframe according to claim 1, wherein the acicular oxide crystals further contain Cu$_2$O.

3. The leadframe according to claim 2, wherein the surface layer includes at least one film selected from the group consisting of an amorphous oxide film and a microcrystalline oxide film, and the selected film contacts the acicular oxide crystals.

4. The leadframe according to claim 2, wherein the acicular oxide crystals include tips, and the tips have a lower atomic ratio (Cu/O) than portions of the acicular oxide crystals other than the tips.

5. The leadframe according to claim 4, wherein the portions of the acicular oxide crystals include base ends, and wherein the acicular oxide crystals directly contact the copper plating film at the base ends.

6. The leadframe according to claim 1, wherein a thickness of the surface layer containing the acicular oxide crystals is 30 nm or more.

7. The leadframe according to claim 1, wherein the acicular oxide crystals include tips and base ends, and the tips have a lower atomic ratio (Cu/O) than the base ends.

8. The leadframe according to claim 1, wherein the surface layer includes at least one film selected from the group consisting of an amorphous oxide film and a microcrystalline oxide film, and the selected film contacts the acicular oxide crystals.

9. The leadframe according to claim 7, wherein the acicular oxide crystals are bound to the copper plating film at the base ends, and the tips extend away from the copper plating film.

10. A leadframe package comprising:
the leadframe according to claim 1;
a semiconductor chip mounted on the leadframe; and
a resin that covers the semiconductor chip and at least a part of the leadframe.

11. A leadframe comprising
a copper substrate;
acicular oxide crystals bound to the copper substrate; and
at least one film selected from the group consisting of an amorphous oxide film and a microcrystalline oxide film,
wherein the selected film contacts the acicular oxide crystals,
wherein the acicular oxide crystals contain CuO at a higher concentration than any other component of the acicular oxide crystals,
wherein the acicular oxide crystals directly contact the copper substrate, and
wherein the acicular oxide crystals include tips and base ends, and the acicular oxide crystals are bound to the copper substrate at the base ends.

12. The leadframe according to claim 11, wherein the tips extend away from the copper substrate and have a lower atomic ratio (Cu/O) than the base ends.

13. The leadframe according to claim 11, wherein a thickness of a surface layer containing the acicular oxide crystals is 30 nm or more.

14. The leadframe according to claim 11, wherein the tips have a lower atomic ratio (Cu/O) than portions of the acicular oxide crystals other than the tips.

15. The leadframe according to claim 11, wherein the acicular oxide crystals further contain $Cu_2O$.

16. A leadframe package comprising:
the leadframe according to claim 11;
a semiconductor chip mounted on the leadframe; and
a resin that covers the semiconductor chip and at least a part of the leadframe.

17. A leadframe comprising:
a copper substrate;
acicular oxide crystals bound to the copper substrate, and
at least one film selected from the group consisting of an amorphous oxide film and a microcrystalline oxide film, wherein the selected film contacts the acicular oxide crystals,.
wherein the acicular oxide crystals contain CuO at a higher concentration than any other component of the acicular oxide crystals,
wherein the acicular oxide crystals directly contact the copper substrate, and
wherein the acicular oxide crystals include tips, and the tips have a lower atomic ratio (Cu/O) than portions of the acicular oxide crystals other than the tips.

\* \* \* \* \*